United States Patent
Chen et al.

(10) Patent No.: US 8,778,769 B2
(45) Date of Patent: Jul. 15, 2014

(54) SEMICONDUCTOR PACKAGE HAVING PASSIVE DEVICE AND METHOD FOR MAKING THE SAME

(71) Applicants: Chien-Hua Chen, Kaohsiung (TW); Teck-Chong Lee, Kaohsiung (TW)

(72) Inventors: Chien-Hua Chen, Kaohsiung (TW); Teck-Chong Lee, Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 0 days.

(21) Appl. No.: 13/723,782

(22) Filed: Dec. 21, 2012

(65) Prior Publication Data

US 2013/0115749 A1     May 9, 2013

Related U.S. Application Data

(62) Division of application No. 12/796,279, filed on Jun. 8, 2010, now Pat. No. 8,415,790.

(30) Foreign Application Priority Data

Dec. 31, 2009   (TW) .............................. 98146110 A

(51) Int. Cl.
    H01L 23/34   (2006.01)
    H01L 21/20   (2006.01)

(52) U.S. Cl.
    USPC ........................ 438/381; 438/106; 257/724

(58) Field of Classification Search
    USPC .............. 438/381, FOR. 220, 106, 386, 110; 257/724, E21.499, E25.029
    See application file for complete search history.

(56) References Cited

U.S. PATENT DOCUMENTS

| 4,886,200 | A | 12/1989 | Tsumura |
| 5,060,051 | A | 10/1991 | Usuda |
| 5,962,872 | A | 10/1999 | Zhang et al. |
| 6,439,450 | B1 | 8/2002 | Chapman et al. |
| 6,933,601 | B2 | 8/2005 | Satoh et al. |
| 6,966,480 | B2 | 11/2005 | Chapman et al. |
| 7,050,481 | B1 | 5/2006 | Hulbert |
| 7,075,167 | B2 | 7/2006 | Harris et al. |
| 7,214,606 | B2 | 5/2007 | Wong et al. |
| 7,381,607 | B2 | 6/2008 | Harris et al. |
| 7,642,584 | B2 | 1/2010 | Yamazaki et al. |
| 2004/0195567 | A1* | 10/2004 | Ogino et al. ................ 257/59 |
| 2009/0140381 | A1* | 6/2009 | Lin et al. ................... 257/528 |
| 2010/0065942 | A1* | 3/2010 | Lin et al. ................... 257/531 |
| 2011/0156204 | A1 | 6/2011 | Chen et al. |
| 2011/0156247 | A1 | 6/2011 | Chen et al. |

FOREIGN PATENT DOCUMENTS

CN    101000898    7/2007

* cited by examiner

*Primary Examiner* — Yasser A Abdelaziez
*Assistant Examiner* — Cory Eskridge
(74) *Attorney, Agent, or Firm* — McCracken & Frank LLC

(57) ABSTRACT

The present invention relates to a semiconductor package and a method for making the same. The semiconductor package includes a substrate, a first capacitor, a first protective layer, a first metal layer and a second protective layer. The substrate has at least one via structure. The first capacitor is disposed on a first surface of the substrate. The first protective layer encapsulates the first capacitor. The first metal layer is disposed on the first protective layer, and includes a first inductor. The second protective layer encapsulates the first inductor. Whereby, the first inductor, the first capacitor and the via structure are integrated into the semiconductor package, so that the size of the product is reduced.

10 Claims, 19 Drawing Sheets

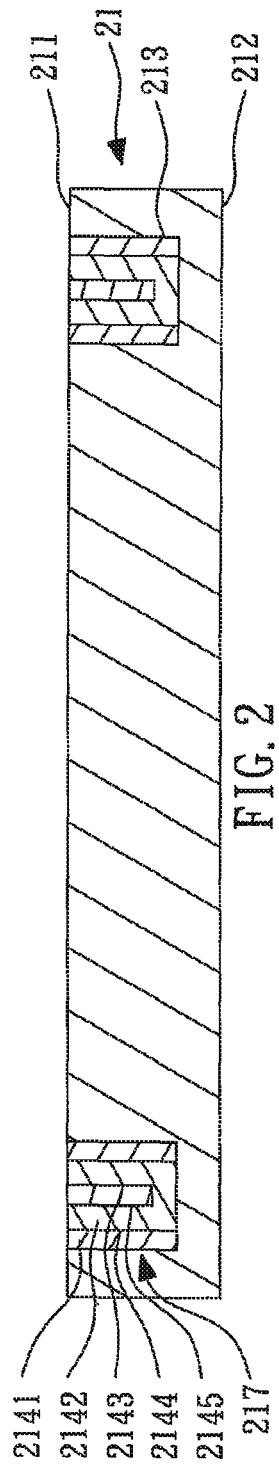
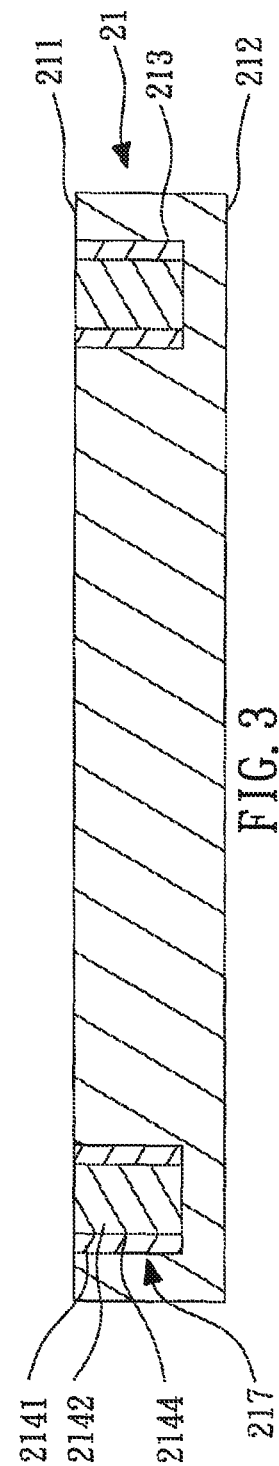

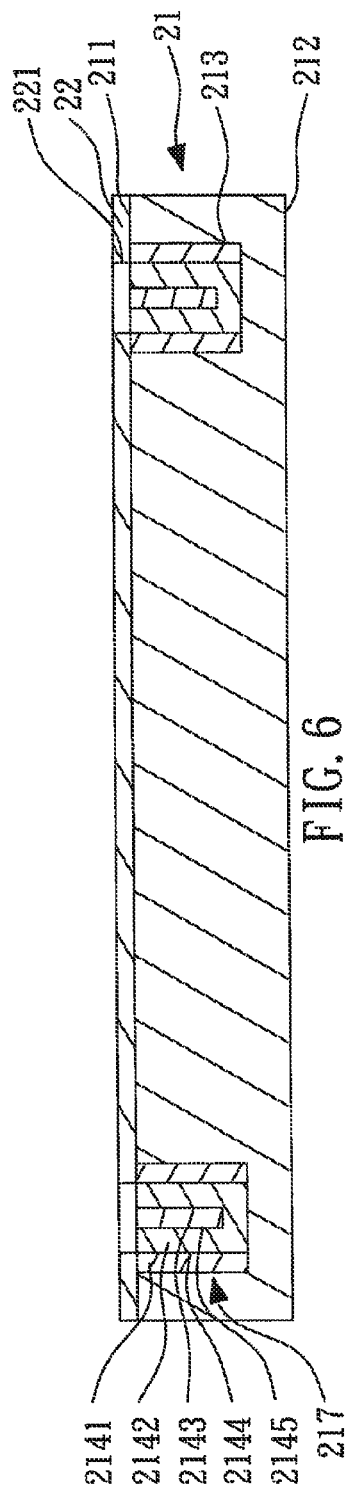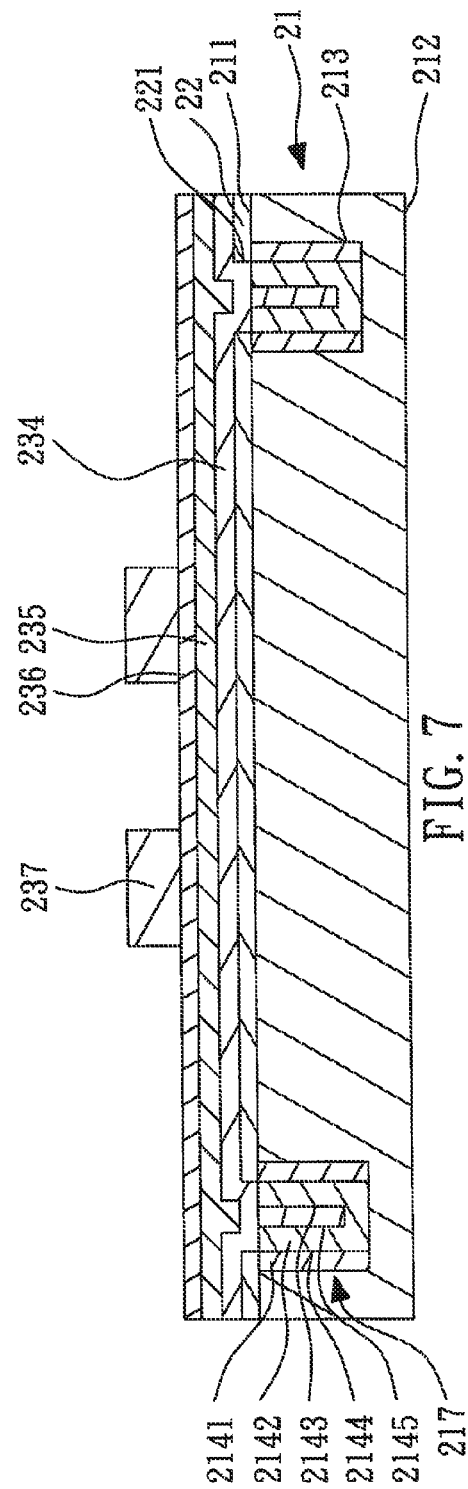

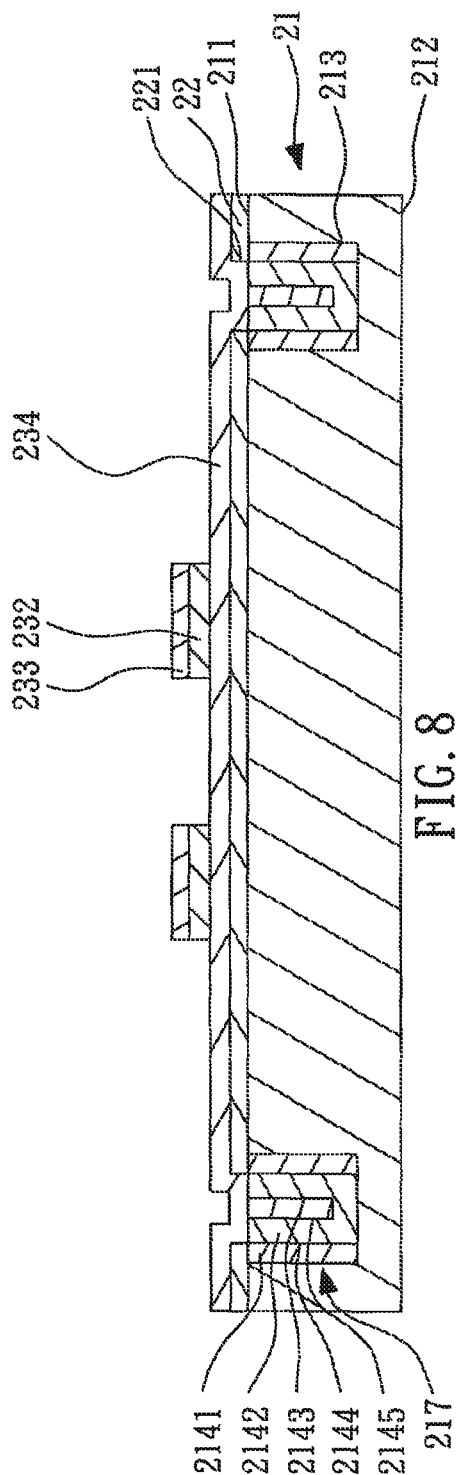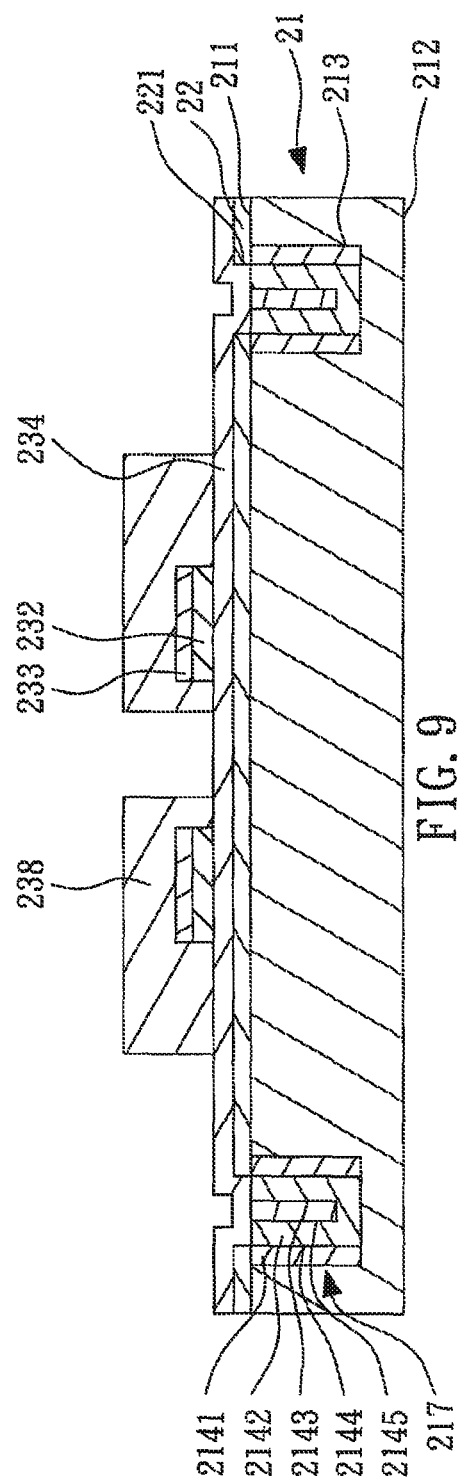

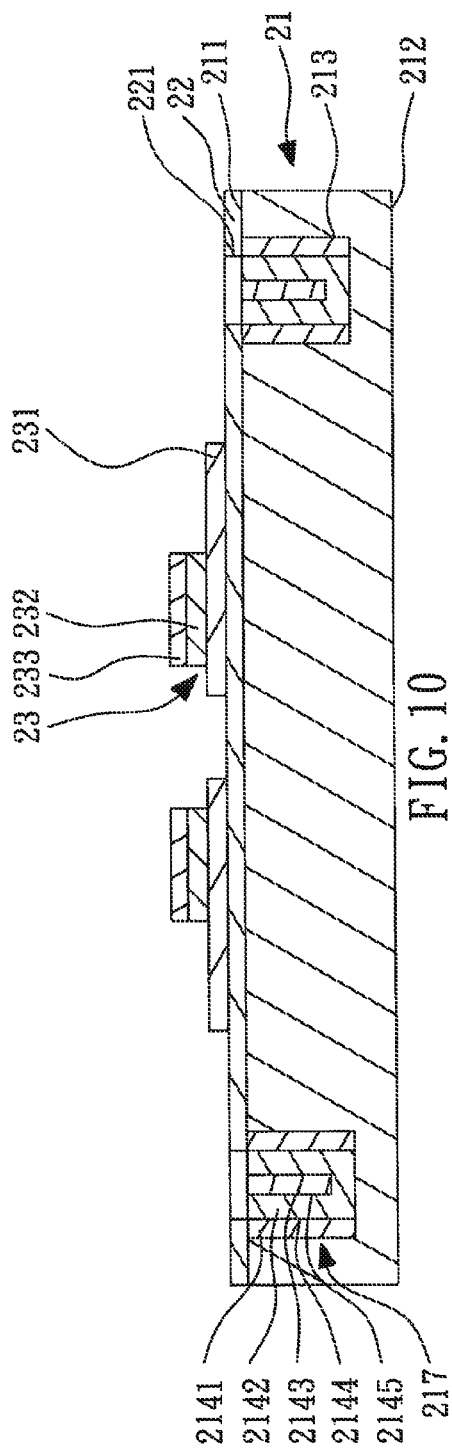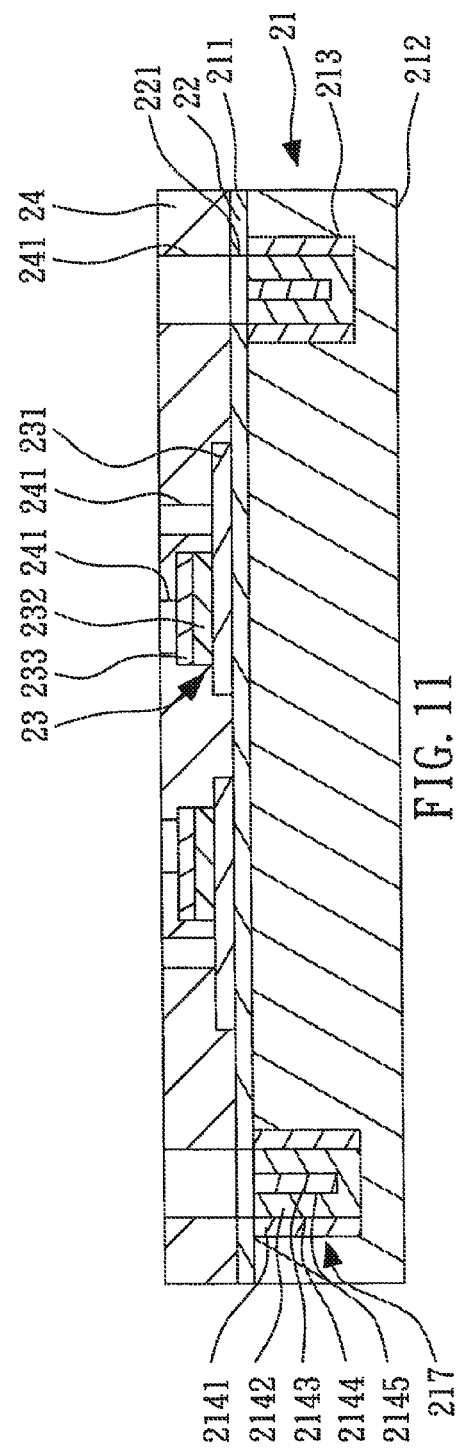

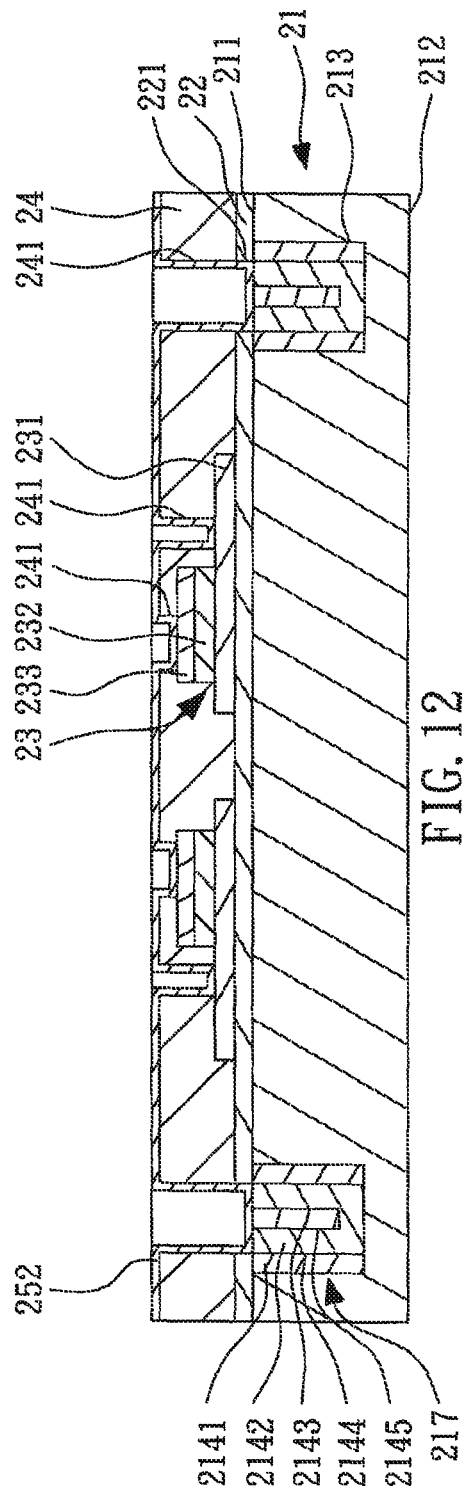
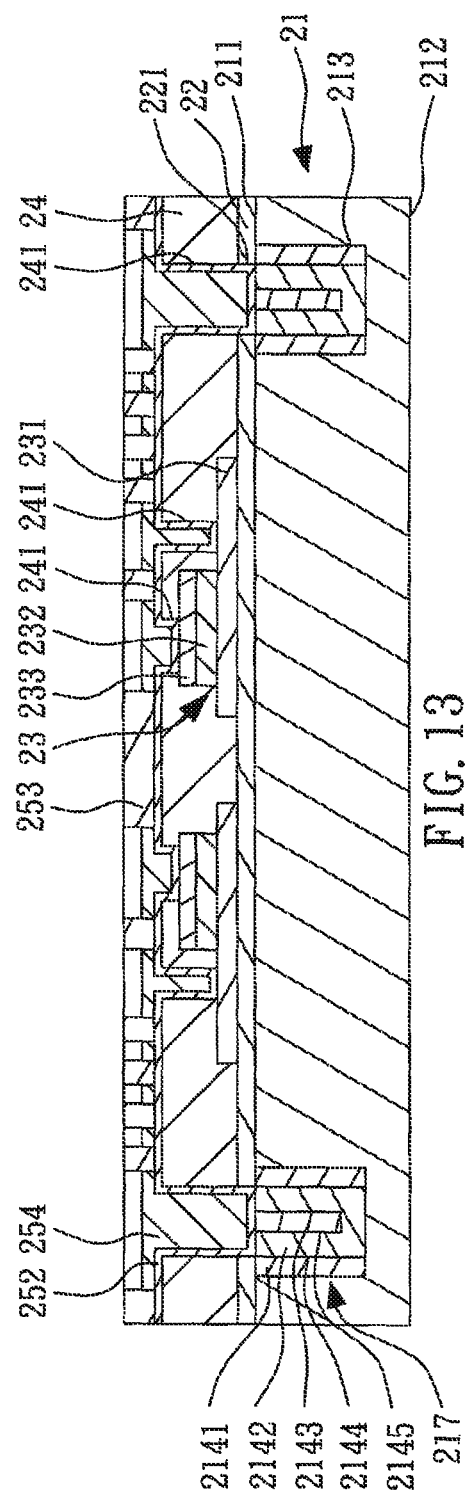

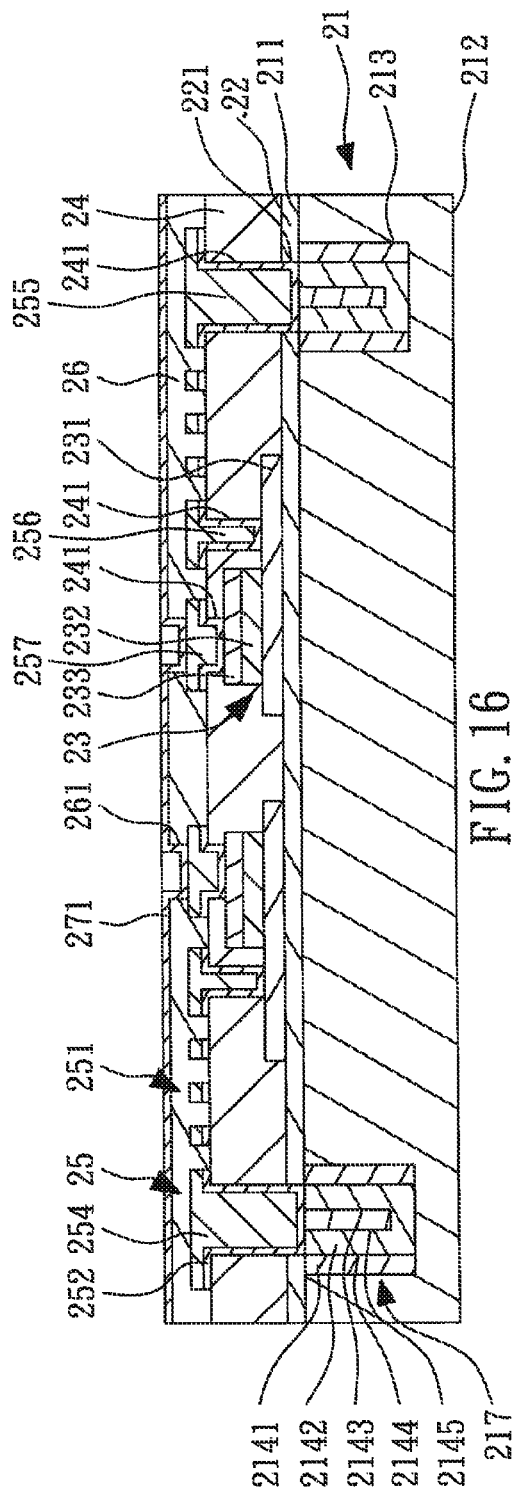
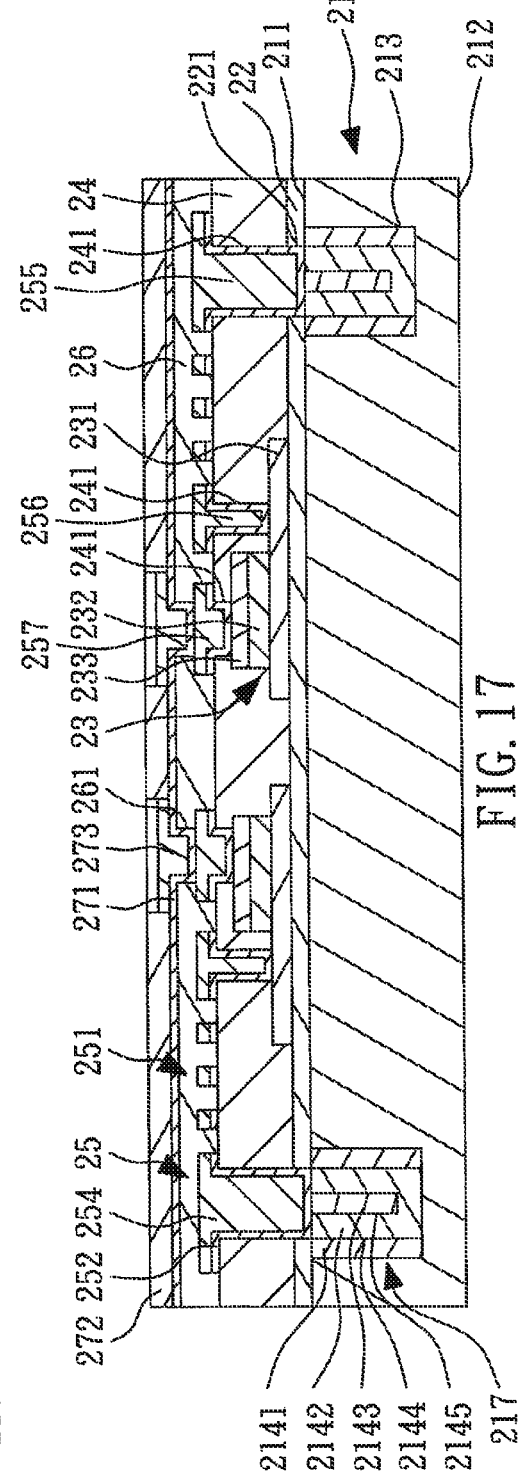

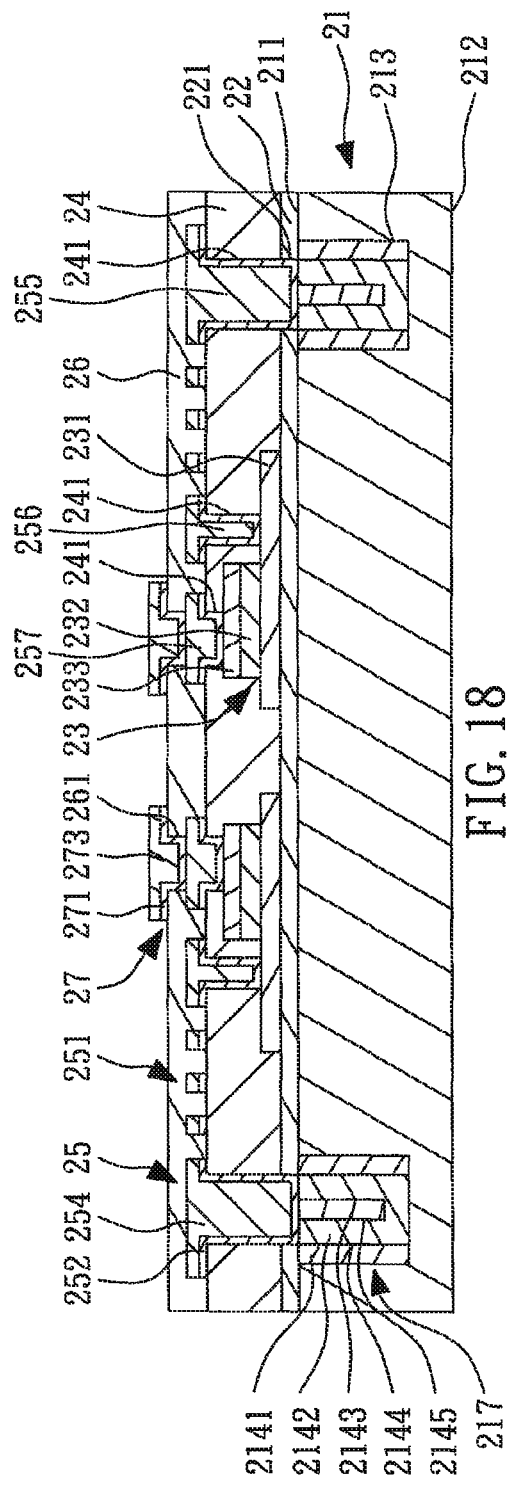
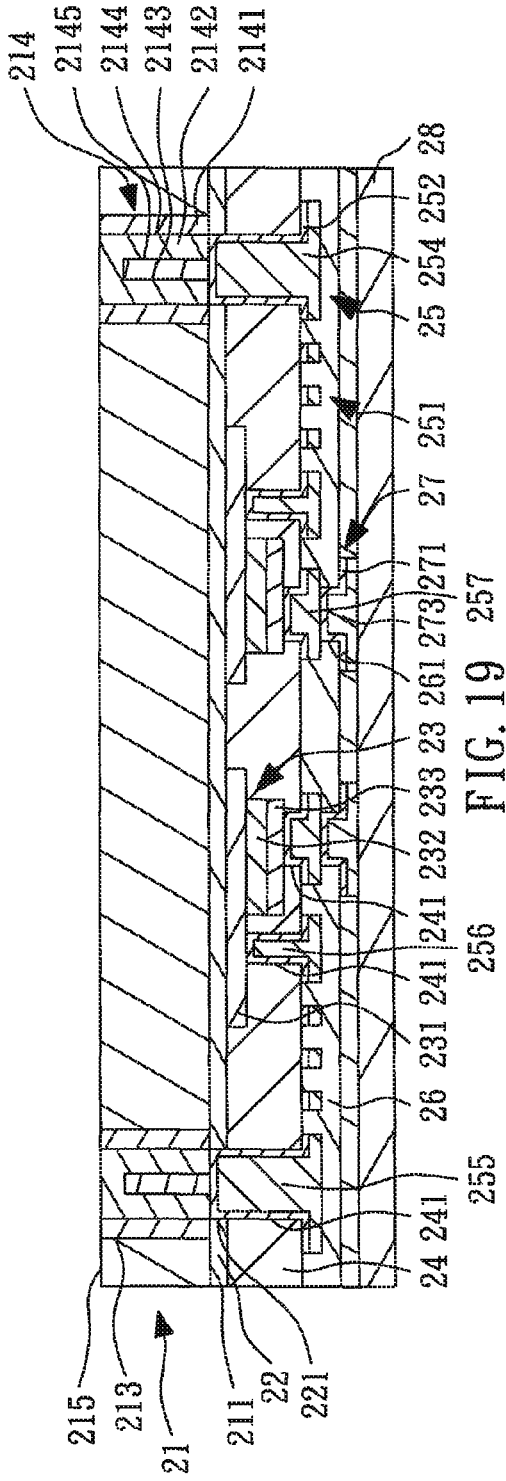
FIG. 18
FIG. 19

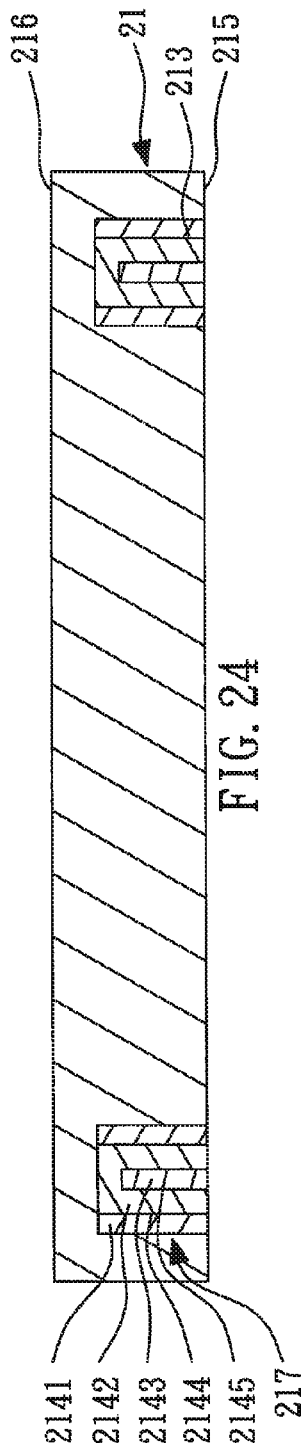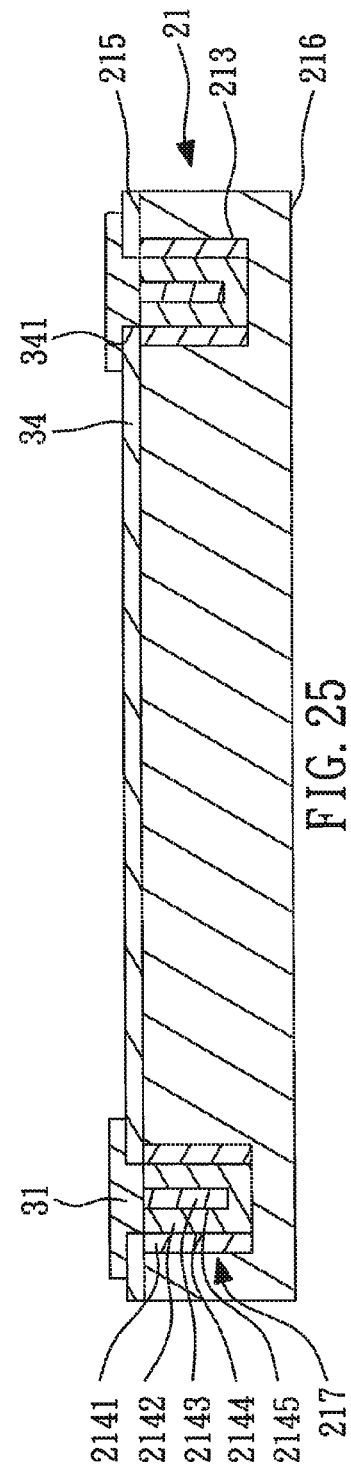

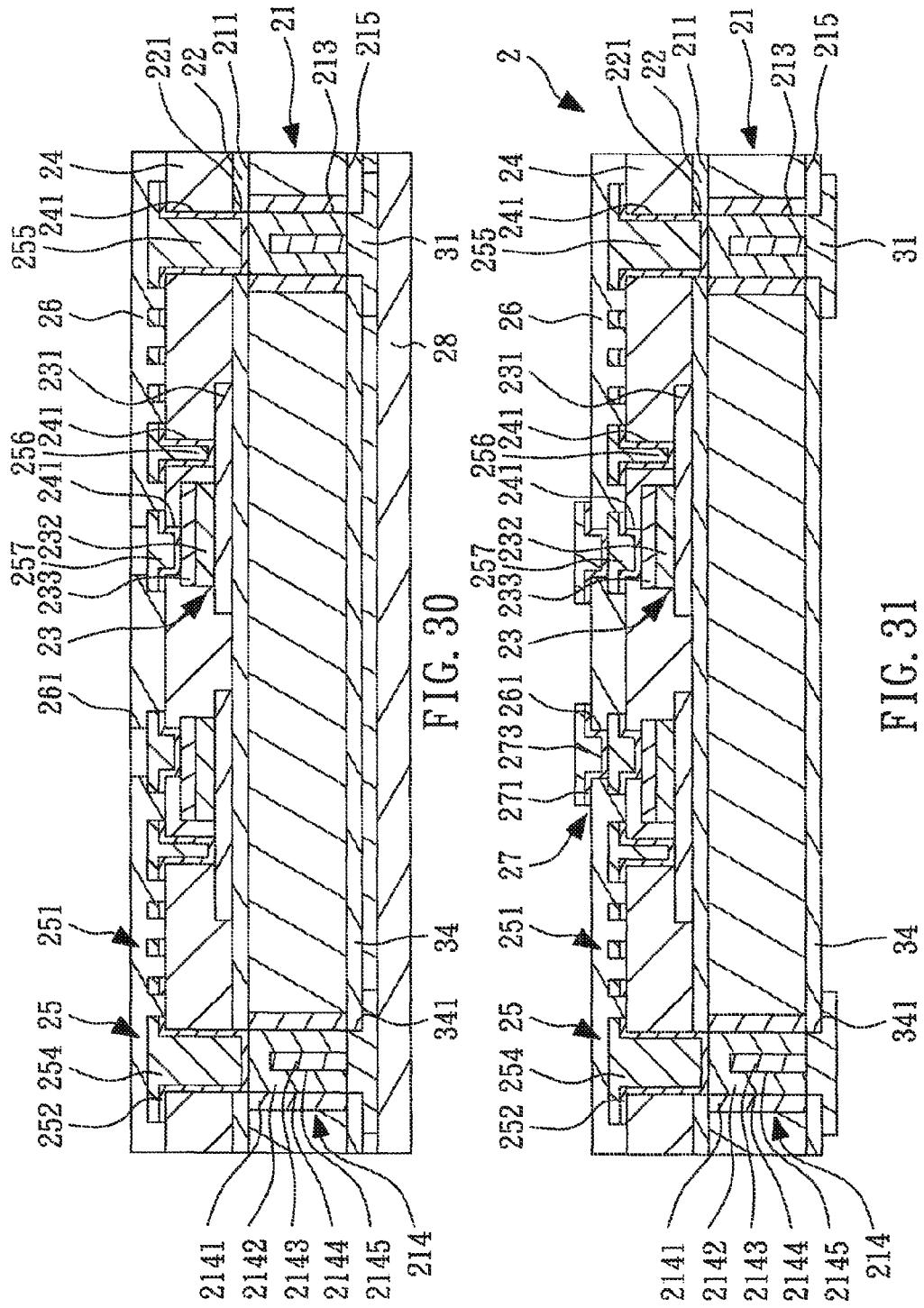

SEMICONDUCTOR PACKAGE HAVING PASSIVE DEVICE AND METHOD FOR MAKING THE SAME

BACKGROUND OF THE INVENTION

1. Field of the Invention

The present invention relates to a semiconductor package and a method for making the same, and more particularly, to a semiconductor package with passive devices and a method for making the same.

2. Description of the Related Art

FIG. 1 shows a cross-sectional view of a conventional semiconductor package. As shown in FIG. 1, the conventional semiconductor package 1 comprises a substrate 11, a packaged unit 12 and a molding compound 13. The packaged unit 12 comprises a plurality of passive devices (not shown). The packaged unit 12 is disposed on and is electrically connected to the substrate 11. The molding compound 13 encapsulates the packaged unit 12.

The conventional semiconductor package 1 has following defects. Since the passive devices are first integrated in the packaged unit 12 by using a semiconductor process and the packaged unit 12 is then electrically connected to the substrate 11 by wire bonding or flip-chip bonding (not shown), thus causing a complicated process of integrating the passive devices in the packaged unit 12 and a high production cost.

Consequently, there is an existing need for a semiconductor package and a method for making the same that solves the above-mentioned problems.

SUMMARY OF THE INVENTION

The present invention provides a method for making a semiconductor package. The method comprises the steps of: (a) providing a base material, wherein the base material comprises at least one groove and at least one conductive via structure; (b) forming a first capacitor on the base material, wherein the first capacitor comprises a first lower electrode, a first dielectric layer and a first upper electrode, the first lower electrode is disposed on the base material, the first dielectric layer is disposed on the first lower electrode, and the first upper electrode is disposed on the first dielectric layer; (c) forming a first protective layer, so as to encapsulate the first capacitor, wherein the first protective layer comprises a plurality of first openings, and the first openings expose the conductive via structure, part of the first lower electrode and part of the first upper electrode; (d) forming a first metal layer on the first protective layer, wherein the first metal layer comprises a first inductor, and directly contacts the conductive via structure, the first lower electrode and the first upper electrode; and (e) forming a second protective layer, so as to encapsulate the first inductor.

Whereby, the process of producing the first inductor and the first capacitor is simplified.

The present invention further provides a semiconductor package. The semiconductor package includes a base material, a first metal layer, a first dielectric layer, a first upper electrode and a first protective layer. The base material has a first surface and a second surface. The first metal layer is disposed on the first surface of the base material and includes a first inductor and a first lower electrode. The first dielectric layer is disposed on the first lower electrode. The first upper electrode is disposed on the first dielectric layer, and the first upper electrode, the first dielectric layer and the first lower electrode form a first capacitor. The first protective layer encapsulates the first inductor and the first capacitor.

The present invention further provides a semiconductor package. The semiconductor package includes a base material, a first capacitor, a first protective layer, a first metal layer and a second protective layer. The base material has a first surface, a second surface, at least one groove and at least one through via structure. The groove penetrates the first surface and the second surface, and the through via structure is disposed in the groove and exposed on the first surface and the second surface. The first capacitor is disposed on the first surface of the base material and comprises a first lower electrode, a first dielectric layer and a first upper electrode. The first lower electrode is disposed on the first surface of the base material, the first dielectric layer is disposed on the first lower electrode, and the first upper electrode is disposed on the first dielectric layer. The first protective layer encapsulates the first capacitor. The first protective layer comprises a plurality of first openings, and the first openings expose the through via structure, part of the first lower electrode and part of the first upper electrode. The first metal layer is disposed on the first protective layer, comprises a first inductor, and directly contacts the through via structure, the first lower electrode and the first upper electrode. The second protective layer encapsulates the first inductor.

Whereby, the first inductor, the first capacitor and the through via structure can be integrated into the semiconductor package, so that the size of the product is reduced.

BRIEF DESCRIPTION OF THE DRAWINGS

FIGS. 2-21 are schematic views of a first embodiment of a method for making a semiconductor package according to the present invention;

FIGS. 24-31 are schematic views of a fourth embodiment of a method for making a semiconductor package according to the present invention.

DETAILED DESCRIPTION OF THE INVENTION

Figure 1:
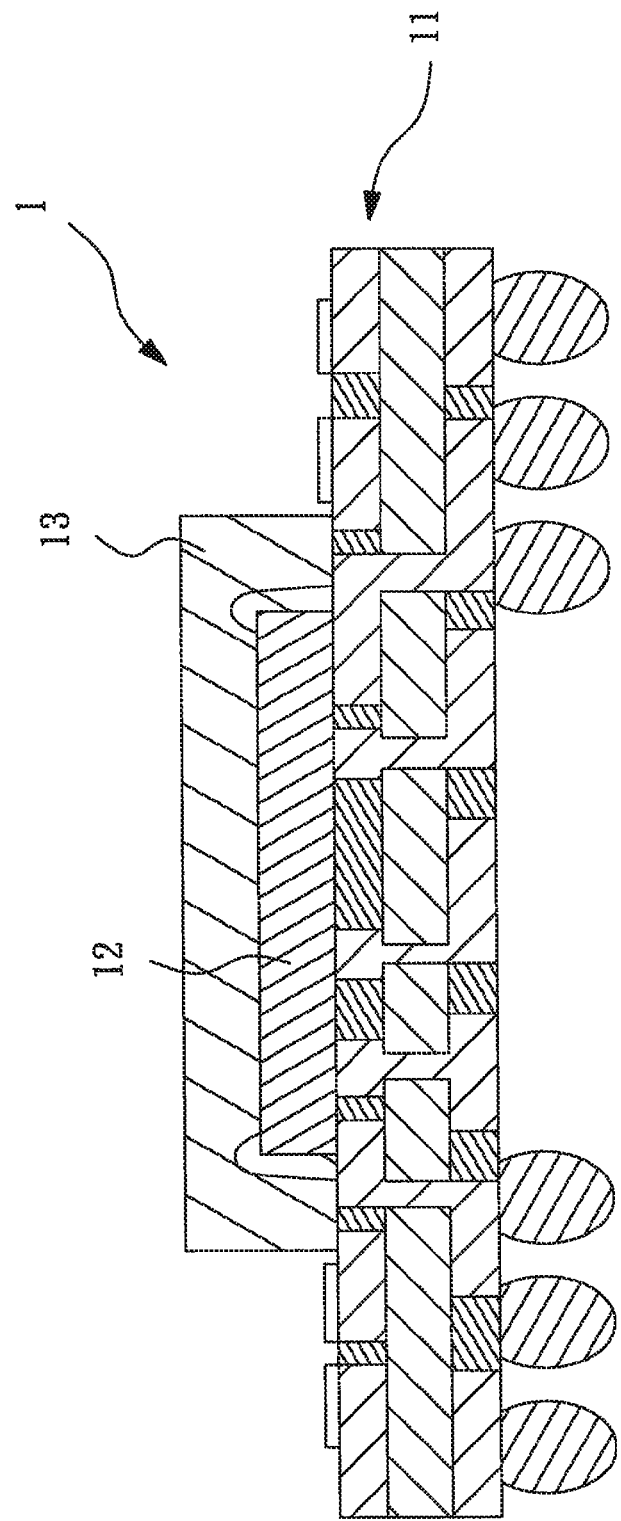
FIG. 1 is a cross-sectional view of a conventional semiconductor package.

FIGS. 2-21 are schematic views of a first embodiment of a method for making a semiconductor package according to the present invention. As shown in FIG. 2, a base material 21 is provided. In this embodiment, the base material 21 comprises a first surface 211, a bottom surface 212, at least one groove 213 and at least one conductive via structure 217. The groove 213 opens at the first surface 211 of the base material 21. The conductive via structure 217 is disposed in the groove 213 and exposed on the first surface 211 of the base material 21.

In this embodiment, the base material 21 is made of non-insulation material such as silicon or germanium. The conductive via structure 217 comprises an outer insulation layer 2141, a conductor 2142 and an inner insulation layer 2143. The outer insulation layer 2141 is disposed on the side wall of the groove 213 to define a second central groove 2144, the conductor 2142 is disposed on the side wall of the second central groove 2144 so as to define a first central groove 2145, and the first central groove 2145 is filled with the inner insulation layer 2143. In other embodiments, the outer insulation layer 2141 can also be disposed on the bottom wall of the groove 213 (not shown). Since the base material 21 is made of non-insulation material, the outer insulation layer 2141 is used to insulate the base material 21 and the conductor 2142 to avoid the current which passes through the through via structure 214 being conducted to the base material 21 and reducing the electrical effects of the conductive via structure 217.

Figure 4:
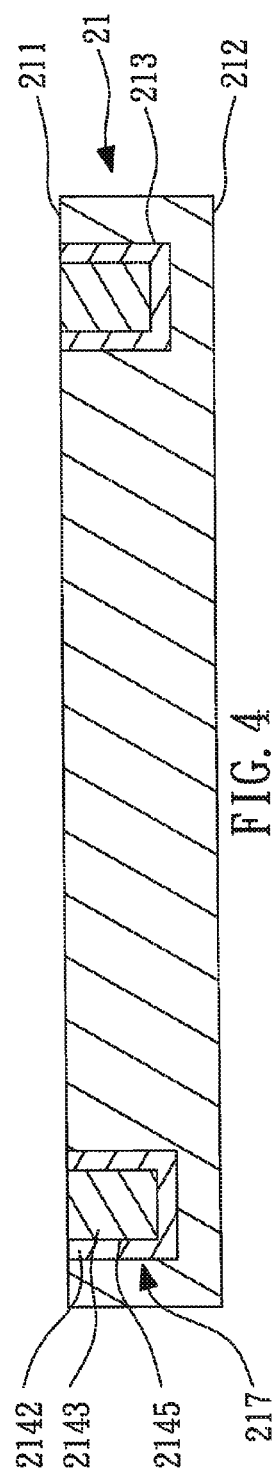
Figure 5:
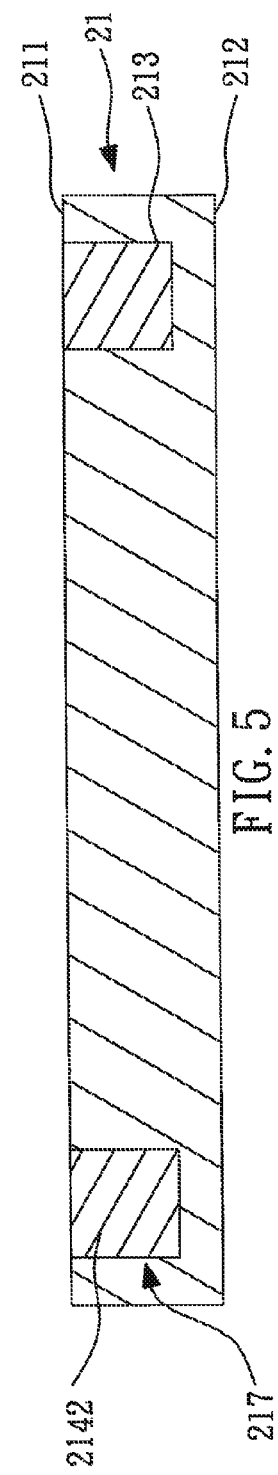

However, in other embodiments, as shown in FIG. 3, the conductive via structure 217 can only comprise an outer insulation layer 2141 and a conductor 2142 but does not comprise the inner insulation layer 2143 (FIG. 2). The outer insulation layer 2141 is disposed on the side wall of the groove 213 to define a second central groove 2144, and the second central groove 2144 is filled with the conductor 2142. In addition, the base material 21 can be made of insulation material such as glass or silica, and the conductive via structure 217 may not comprise the outer insulation layer 2141 (FIG. 2). Therefore, as shown in FIG. 4, the conductive via structure 217 can only comprise a conductor 2142 and an inner insulation layer 2143, wherein the conductor 2142 is disposed on the side wall and the bottom portion of the groove 213 to define a first central groove 2145, and the first central groove 2145 is filled with the inner insulation layer 2143. Alternatively, as shown in FIG. 5, the conductive via structure 217 can only comprise a conductor 2142, wherein the groove 213 is filled with the conductor 2142. As shown in FIG. 6, a first insulation layer 22 is formed on the base material 21. In this embodiment, the first insulation layer 22 is formed on the first surface 211 of the base material 21 and has a first through hole 221, and the first through hole 221 exposes the conductive via structure 217. However, in other embodiments, the first insulation layer 22 is not necessarily required.

Then, a first capacitor 23 (FIG. 10) is formed on the base material 21. The first capacitor 23 comprises a first lower electrode 231, a first dielectric layer 232 and a first upper electrode 233. The first lower electrode 231 is disposed on the base material 21, the first dielectric layer 232 is disposed on the first lower electrode 231, and the first upper electrode 233 is disposed on the first dielectric layer 232. In this embodiment, the first capacitor 23 is disposed on the first insulation layer 22. In this embodiment, the steps of forming the first capacitor 23 are described as follows. As shown in FIG. 7, firstly, a second metal layer 234 is formed (for example, by sputtering) on the base material 21. The second metal layer 234 is made of AlCu. Then, a third metal layer is formed (for example, by sputtering) on the second metal layer 234, and the third metal layer is anodized, so as to form a first oxidation layer 235. The first oxidation layer 235 is made of tantalum pentoxide ($Ta_2O_5$). Then, a fourth metal layer 236 is formed (for example, by sputtering) on the first oxidation layer 235. The fourth metal layer 236 is made of AlCu. Finally, a first photoresist 237 is formed on the fourth metal layer 236. As shown in FIG. 8, part of the first oxidation layer 235 (FIG. 7) and part of the fourth metal layer 236 (FIG. 7) are removed, so as to form the first dielectric layer 232 and the first upper electrode 233, respectively, and the first photoresist 237 is removed. As shown in FIG. 9, a second photoresist 238 is formed on the second metal layer 234, and the second photoresist 238 encapsulates the first dielectric layer 232 and the first upper electrode 233. As shown in FIG. 10, part of the second metal layer 234 (FIG. 9) so as to form the first lower electrode 231 and the second photoresist 238 (FIG. 9) is removed, and the first capacitor 23 is made. As shown in FIG. 11, a first protective layer 24 is formed, so as to encapsulate the first capacitor 23. The first protective layer 24 comprises a plurality of first openings 241, and the first openings 241 expose the conductive via structure 217, part of the first lower electrode 231 and part of the first upper electrode 233.

Figure 14:
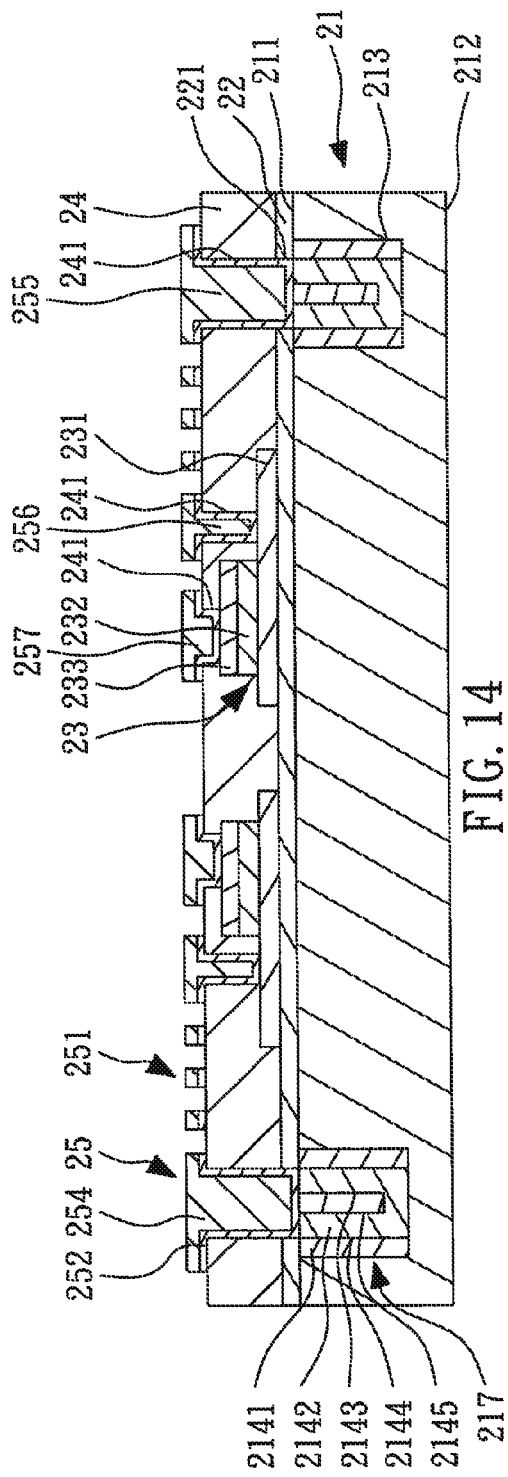
Figure 15:
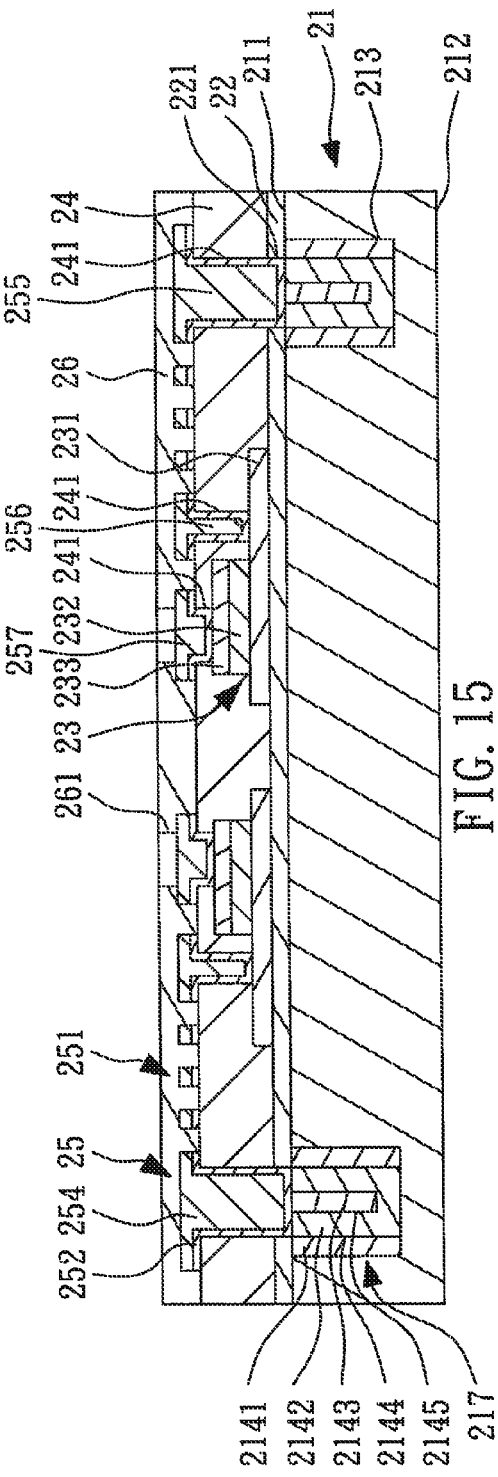

Then, a first metal layer 25 (FIG. 14) is formed on the first protective layer 24. The first metal layer 25 comprises a first inductor 251. Preferably, the first openings 241 are filled with the first metal layer 25, so as to form a first interconnection metal 255, a second interconnection metal 256 and a third interconnection metal 257. The first interconnection metal 255 directly contacts the conductive via structure 217, the second interconnection metal 256 directly contacts the first lower electrode 231, and the third interconnection metal 257 directly contacts the first upper electrode 233. In this embodiment, the steps of forming the first metal layer 25 are described as follows. As shown in FIG. 12, a first seed layer 252 is formed on the first protective layer 24. As shown in FIG. 13, a third photoresist 253 is formed on the first seed layer 252, so as to cover part of the first seed layer 252 and expose part of the first seed layer 252, and a first plated layer 254 is formed on the exposed part of the first seed layer 252. As shown in FIG. 14, the third photoresist 253 (FIG. 13) and the covered part of the first seed layer 252 are removed, and the first plated layer 254 and part of the first seed layer 252 form the first metal layer 25. As shown in FIG. 15, a second protective layer 26 is formed, so as to encapsulate the first inductor 251. The second protective layer 26 comprises at least one second opening 261, and the second opening 261 exposes part of the first metal layer 25.

Then, at least one first bump 27 (FIG. 18) is formed in the second opening 261 of the second protective layer 26. In this embodiment, the steps of forming the first bump 27 are described as follows. As shown in FIG. 16, a second seed layer 271 is formed on the second protective layer 26. As shown in FIG. 17, a fourth photoresist 272 is formed on the second seed layer 271, so as to cover part of the second seed layer 271 and expose part of the second seed layer 271, and a second plated layer 273 is formed on the exposed part of the second seed layer 271. As shown in FIG. 18, the fourth photoresist 272 (FIG. 17) and the covered part of the second seed layer 271 are removed, so as to form the first bump 27.

As shown in FIG. 19, the base material 21 is disposed on a carrier 28, wherein the first surface 211 of the base material 21 faces the carrier 28. Part of the base material 21 is removed from the bottom surface 212 (FIG. 18), to form a second surface 215 and expose the conductor 2142 of the conductive via structure 217 (FIG. 18) on the second surface 215, so as to form a through via structure 214. However, in other embodiments, more part of the base material 21 can be further removed, so that the inner insulation layer 2143 of the conductive via structure 217 (FIG. 18) is also exposed on the second surface 215, which can ensure that the conductor 2142 is exposed on the second surface 215.

Figure 20:
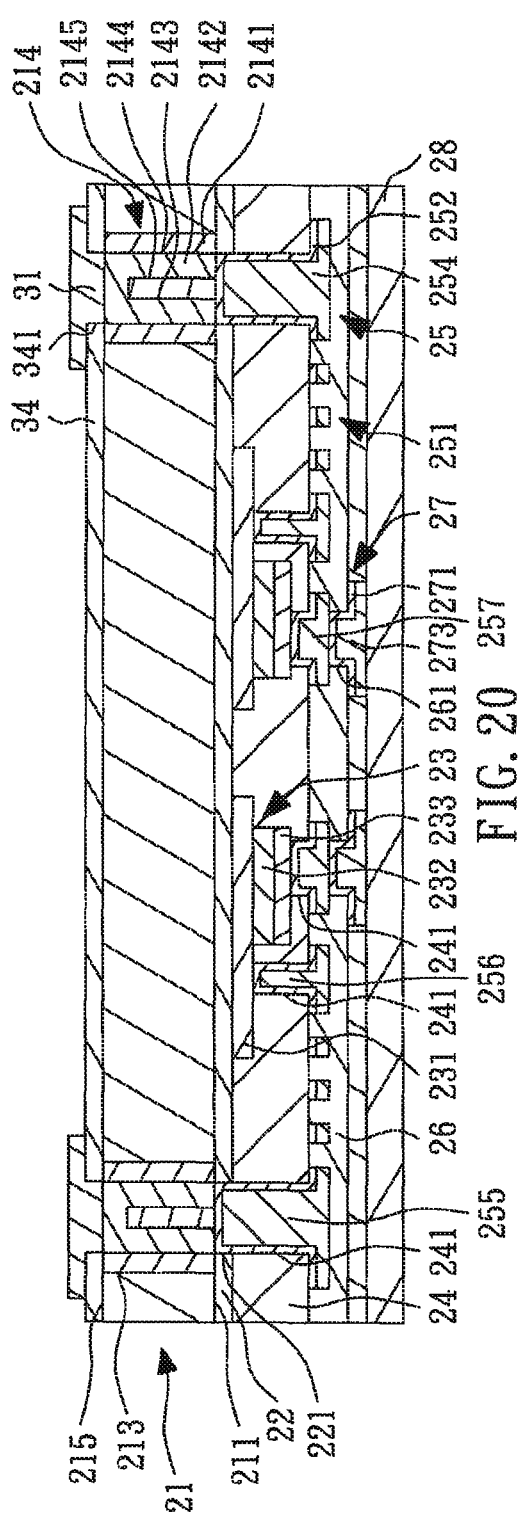
Figure 21:
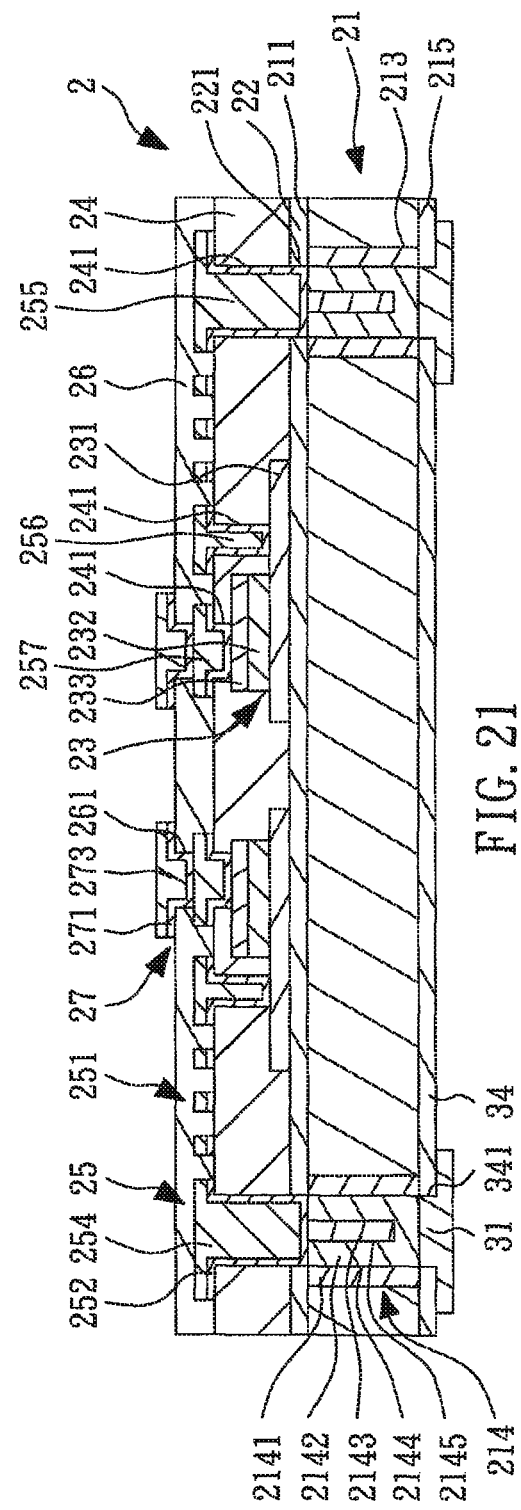
Figure 22:
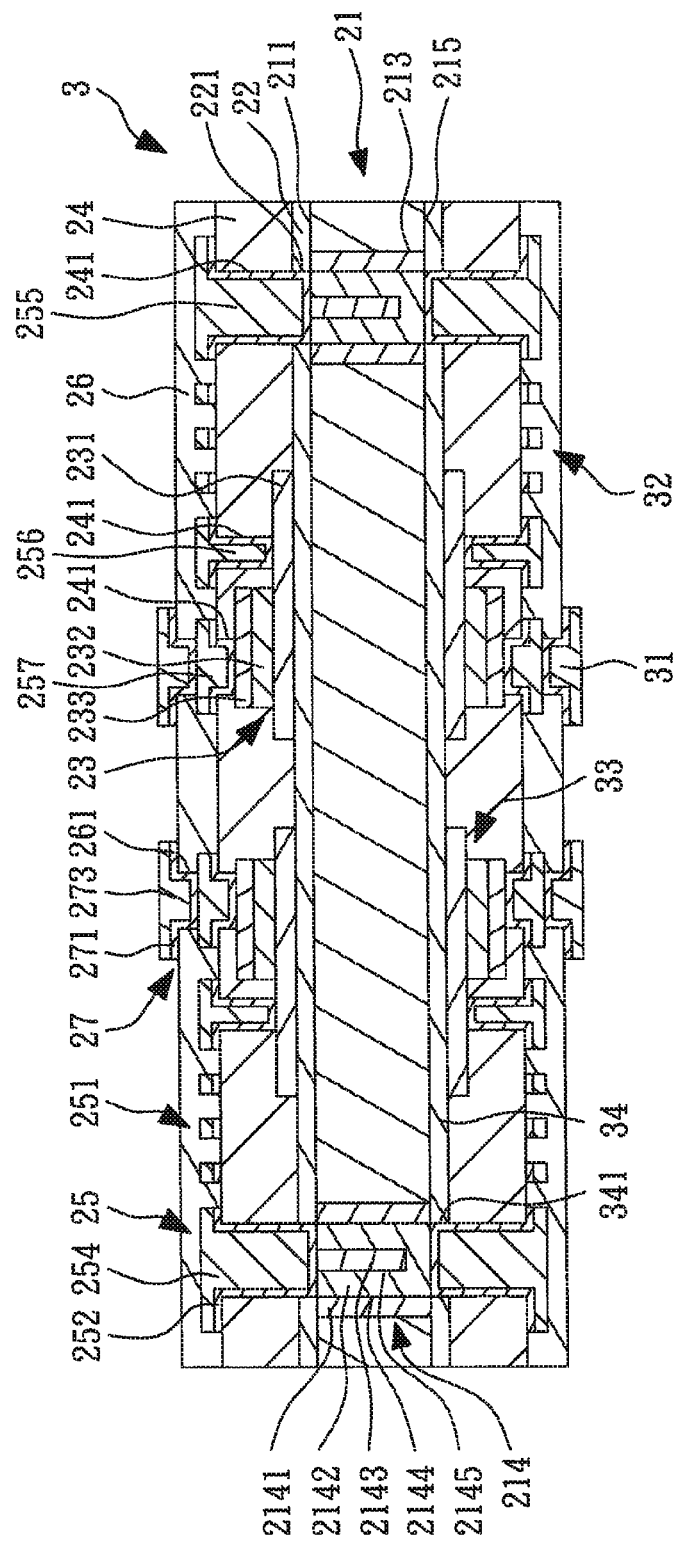
FIG. 22 is a cross-sectional view of a second embodiment of a semiconductor package according to the present invention.

As shown in FIG. 20, at least one electrical device is formed on the second surface 215 of the base material 21. In this embodiment, the electrical device is a second bump 31, and the method for making the second bump 31 is the same as that for making the first bump 27 and therefore not described in detail. As shown in FIG. 21, the carrier 28 (FIG. 20) is removed, and a semiconductor package 2 according to a first embodiment of the present invention is made. However, the electrical device can be a second inductor 32 and a second capacitor 33, as shown in FIG. 22. The method for making the second inductor 32 and the second capacitor 33 is the same as that for making the first inductor 251 and the first capacitor 23. That is, the manufacturing process applied to the second surface 215 of the base material 21 is the same as that applied to the first surface 211 of the base material 21 and therefore not described in detail.

As a result, the process of producing the first inductor 251 and the first capacitor 23 is simplified, and the first inductor 251, the first capacitor 23 and the through via structure 214 can be integrated into the semiconductor package 2, so that the size of the product is reduced.

FIG. 21 is a cross-sectional view of a first embodiment of the semiconductor package according to the present invention. As shown in FIG. 21, the semiconductor package 2 includes a base material 21, a first insulation layer 22, a second insulation layer 34, a first capacitor 23, a first protective layer 24, a first metal layer 25, a second protective layer 26, at least one first bump 27 and at least one electrical device.

The base material 21 comprises a first surface 211, a second surface 215, at least one groove 213 and at least one through via structure 214. The groove 213 penetrates the first surface 211 and the second surface 215. The through via structure 214 is disposed in the groove 213 and exposed on the first surface 211 and the second surface 215.

In this embodiment, the base material 21 is made of non-insulation material such as silicon or germanium. The through via structure 214 comprises an outer insulation layer 2141, a conductor 2142 and an inner insulation layer 2143. The outer insulation layer 2141 is disposed on the side wall of the groove 213 to define a second central groove 2144, the conductor 2142 is disposed on the side wall of the second central groove 2144 so as to define a first central groove 2145, and the first central groove 2145 is filled with the inner insulation layer 2143. In other embodiments, the outer insulation layer 2141 can also be disposed on the bottom wall of the groove 213 (not shown). Since the base material 21 is made of non-insulation material, the outer insulation layer 2141 is used to insulate the base material 21 and the conductor 2142 to avoid the current which passes through the through via structure 214 being conducted to the base material 21 and reducing the electrical effects of the through via structure 214.

However, in other embodiments, the through via structure 214 can only comprise an outer insulation layer 2141 and a conductor 2142 but does not comprise the inner insulation layer 2143. The outer insulation layer 2141 is disposed on the side wall of the groove 213 to define a second central groove 2144, and the second central groove 2144 is filled with the conductor 2142. In addition, the base material 21 can be made of insulation material such as glass or silica, and the through via structure 214 may not comprise the outer insulation layer 2141. Therefore, the through via structure 214 can only comprise a conductor 2142 and an inner insulation layer 2143, wherein the conductor 2142 is disposed on the side wall of the groove 213 to define a first central groove 2145, and the first central groove 2145 is filled with the inner insulation layer 2143. Alternatively, the through via structure 214 can only comprise a conductor 2142, and the groove 213 is filled with the conductor 2142.

The first insulation layer 22 is formed on the first surface 211 of the base material 21 and has a first through hole 221, and the first through hole 221 exposes the through via structure 214. The second insulation layer 34 is disposed on the second surface 215 of the base material 21 and has a second through hole 341, and the second through hole 341 exposes the through via structure 214. The first capacitor 23 is formed on the first insulation layer 22 and comprises a first lower electrode 231, a first dielectric layer 232 and a first upper electrode 233. The first lower electrode 231 is disposed on the first insulation layer 22, the first dielectric layer 232 is disposed on the first lower electrode 231, and the first upper electrode 233 is disposed on the first dielectric layer 232. In this embodiment, the first lower electrode 231 and the first upper electrode 233 are made of AlCu, and the first dielectric layer 232 is made of tantalum pentoxide ($Ta_2O_5$).

The first protective layer 24 encapsulates the first capacitor 23. In this embodiment, the first protective layer 24 comprises a plurality of first openings 241, and the first openings 241 expose the through via structure 214, part of the first lower electrode 231 and part of the first upper electrode 233. The first metal layer 25 is formed on the first protective layer 24 and comprises a first inductor 251. Preferably, part of the first metal layer 25 in the first openings forms a first interconnection metal 255, a second interconnection metal 256 and a third interconnection metal 257. The first interconnection metal 255 directly contacts the through via structure 214, the second interconnection metal 256 directly contacts the first lower electrode 231, and the third interconnection metal 257 directly contacts the first upper electrode 233. The second protective layer 26 encapsulates the first inductor 251. In this embodiment, the second protective layer 26 comprises at least one second opening 261, and the second opening 261 exposes part of the first metal layer 25. The first bump 27 is disposed in the second opening 261 of the second protective layer 26. The electrical device is disposed on the second surface 215 of the base material 21. The electrical device is a second bump.

As a result, the first inductor 251, the first capacitor 23 and the through via structure 214 can be integrated into the semiconductor package 2, so that the size of the product is reduced.

FIG. 22 is a cross-sectional view of a second embodiment of the semiconductor package according to the present invention. As shown in FIG. 22, the semiconductor package 3 of the third embodiment and the semiconductor package 2 (FIG. 21) of the first embodiment are substantially the same, and the same elements are designated with the same numerals. The difference between the second embodiment and the first embodiment is that the second surface 215 of the semiconductor package 3 comprises a plurality of electrical devices such as a second inductor 32, a second capacitor 33 and a second bump 31.

Figure 23:
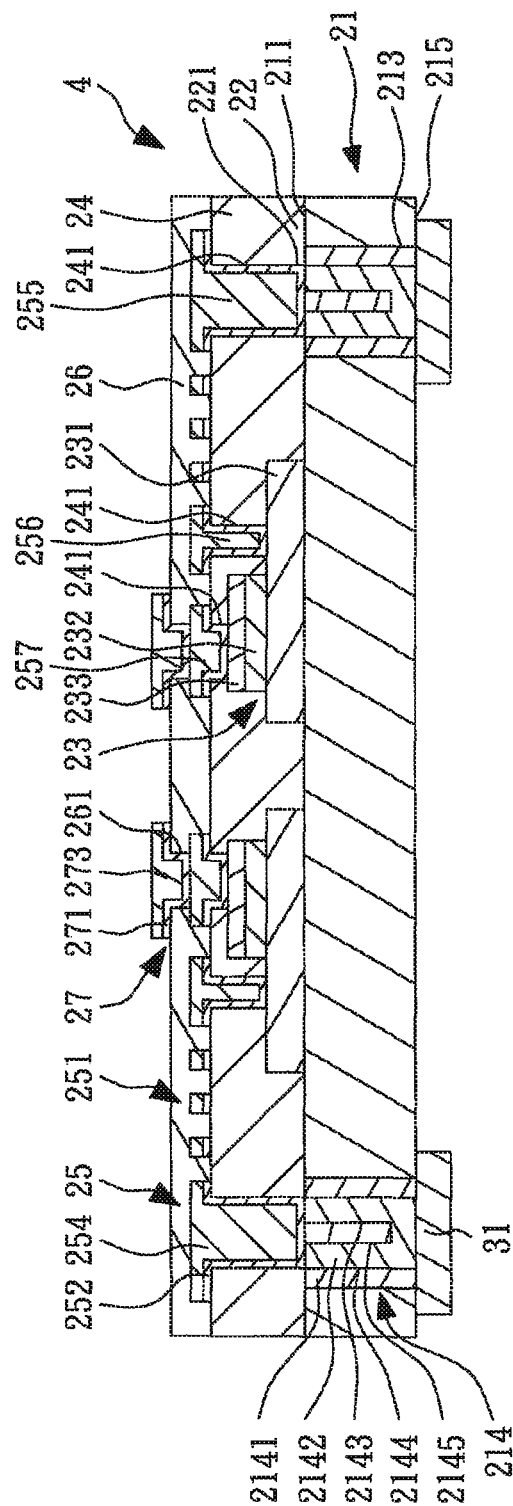
FIG. 23 is a cross-sectional view of a third embodiment of a semiconductor package according to the present invention.

FIG. 23 is a cross-sectional view of a third embodiment of the semiconductor package according to the present invention. As shown in FIG. 23, the semiconductor package 4 of the second embodiment and the semiconductor package 2 (FIG. 21) of the first embodiment are substantially the same, and the same elements are designated with the same numerals. The difference between the third embodiment and the first embodiment is that the semiconductor package 4 does not comprise the first insulation layer 22 and the second insulation layer 34, and preferably, the first capacitor 23 is disposed on the first surface 211 of the base material 21.

Figure 26:
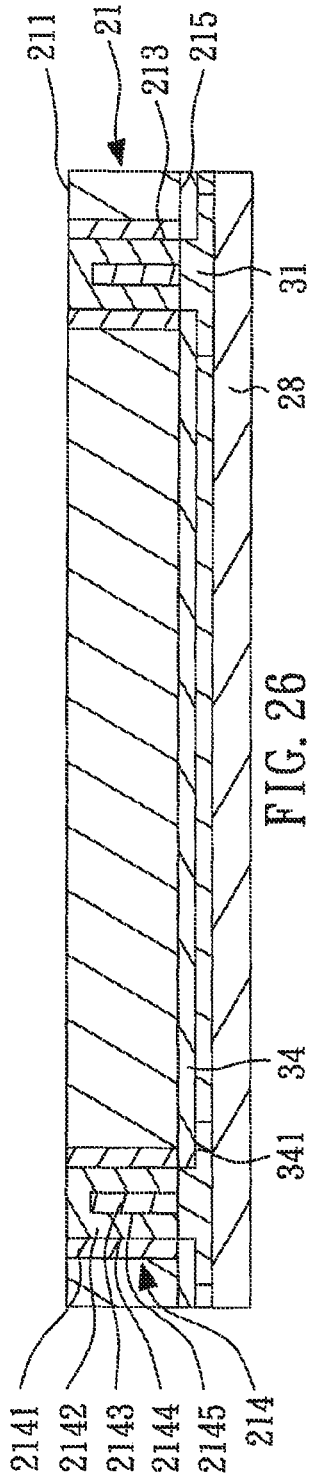

FIGS. 24-31 are schematic views of a fourth embodiment of a method for making a semiconductor package according to the present invention. As shown in FIG. 24, a base material 21 is provided. In this embodiment, the base material 21 comprises a top surface 216 and a second surface 215. The groove 213 opens at the second surface 215 of the base material 21, and the conductive via structure 217 is exposed on the second surface 215 of the base material 21. As shown in FIG. 25, a second insulation layer 34 is disposed on the base material 21. In this embodiment, the second insulation layer 34 is disposed on the second surface 215 of the base material 21 and has a second through hole 341, wherein the second through hole 341 exposes the conductive via structure 217. Then, at least one electrical device is formed on the second surface 215 of the base material 21, preferably on the second insulation layer 34. In this embodiment, the electrical device is a second bump 31. As shown in FIG. 26, the base material 21 is disposed on a carrier 28, wherein the second surface 215 of the base material 21 faces the carrier 28. Part of the base material 21 is removed from the top surface 216 (FIG. 25), to form a first surface 211 and expose the conductive via structure 217 (FIG. 25) on the first surface 211, so as to form a through via structure 214.

Figure 27:
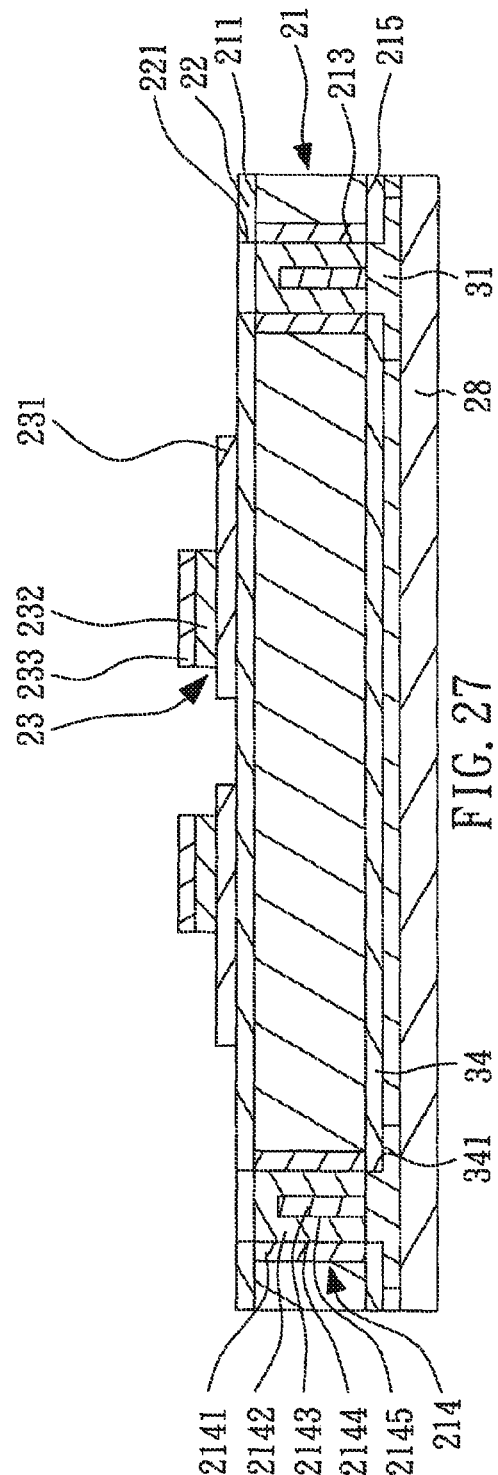
Figure 28:
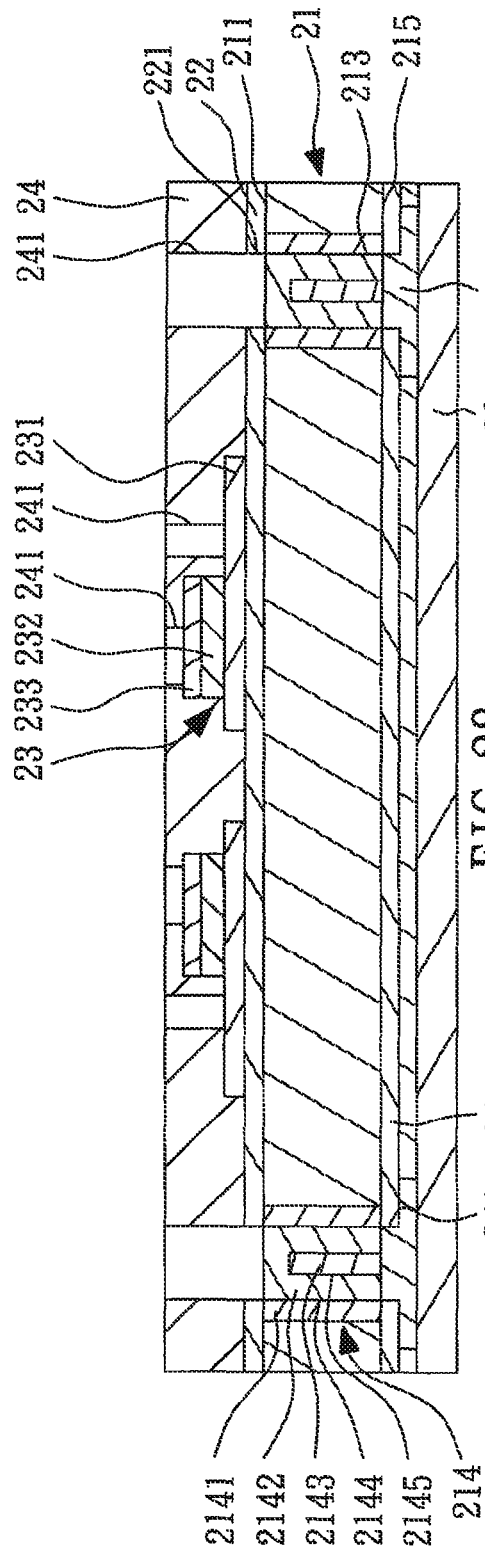
Figure 29:
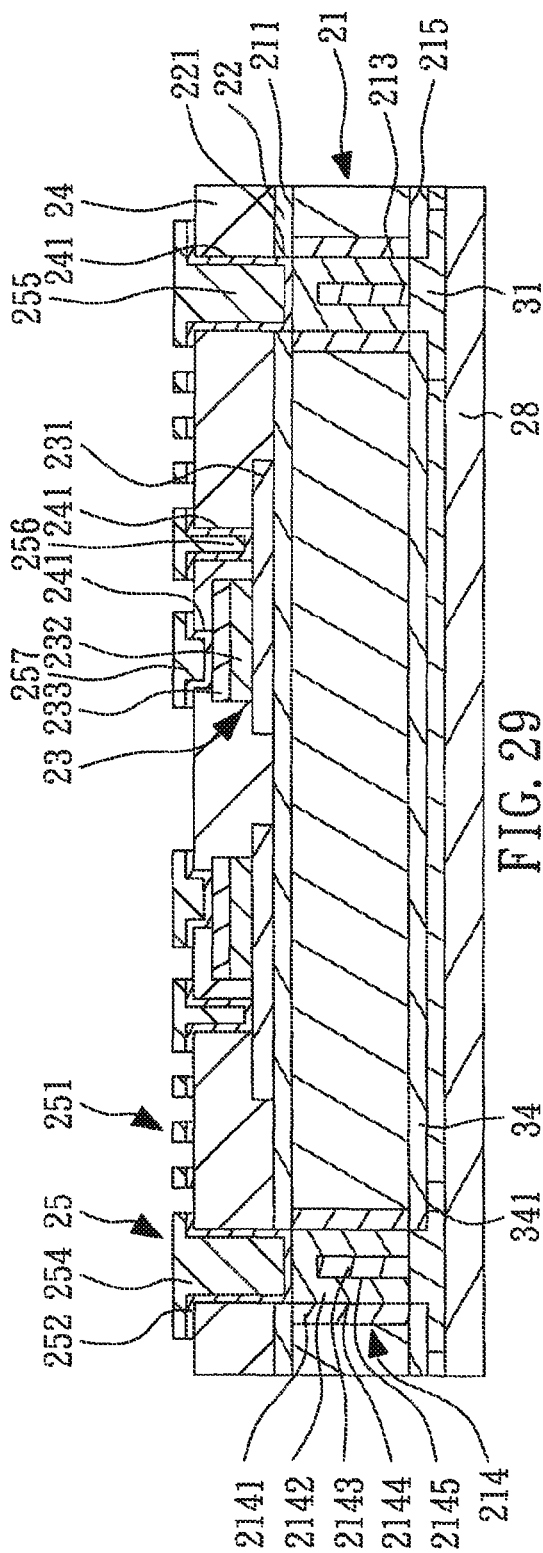

As shown in FIG. 27, a first capacitor 23 is formed on the base material 21. The first capacitor 21 comprises a first lower electrode 231, a first dielectric layer 232 and a first upper electrode 233. The first lower electrode 231 is disposed on the base material 21, the first dielectric layer 232 is disposed on the first lower electrode 231, and the first upper electrode 233 is disposed on the first dielectric layer 232. In this embodiment, the first capacitor 23 is formed on the first insulation layer 22. As shown in FIG. 28, a first protective layer 24 is formed, so as to encapsulate the first capacitor 23. The first protective layer 24 comprises a plurality of first openings 241, and the first openings 241 expose the through via structure 214, part of the first lower electrode 231 and part of the first upper electrode 233. As shown in FIG. 29, a first metal layer 25 is formed on the first protective layer 24. A first plated layer 254 and a first seed layer 252 form the first metal layer 25. The first metal layer 25 comprises a first inductor 251. Preferably, the first openings 241 are filled with the first metal layer 25, so as to form a first interconnection metal 255, a second interconnection metal 256 and a third interconnection metal 257. The first interconnection metal 255 directly contacts the through via structure 214, the second interconnection metal 256 directly contacts the first lower electrode 231, and the third interconnection metal 257 directly contacts the first upper electrode 233. As shown in FIG. 30, a second protective layer 26 is formed, so as to encapsulate the first inductor 251. The second protective layer 26 comprises at least one second opening 261, and the second opening 261 exposes part of the first metal layer 25. As shown in FIG. 31, at least one first bump 27 is formed in the second opening 261 of the second protective layer 26, and a second plated layer 273 and a second seed layer 271 form the first bump 27. Then, the carrier 28 is removed, and the semiconductor package 2 is made.

Figure 32:
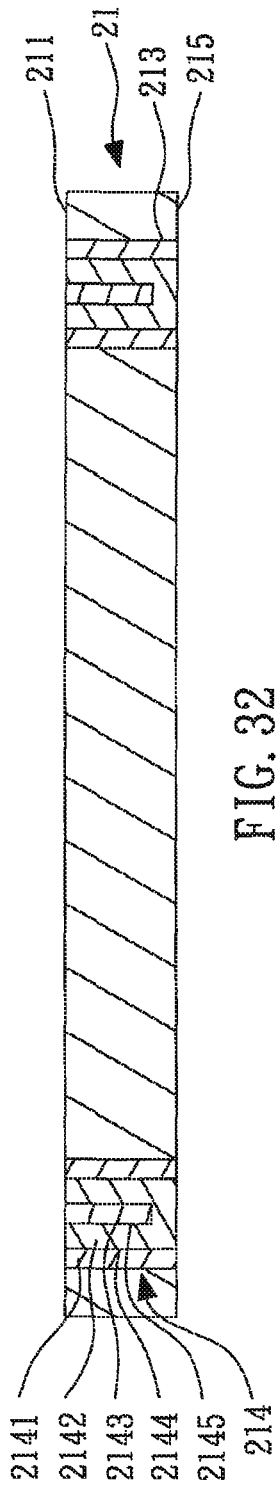
FIGS. 32-34 are schematic views of a fifth embodiment of a method for making a semiconductor package according to the present invention.
Figure 33:
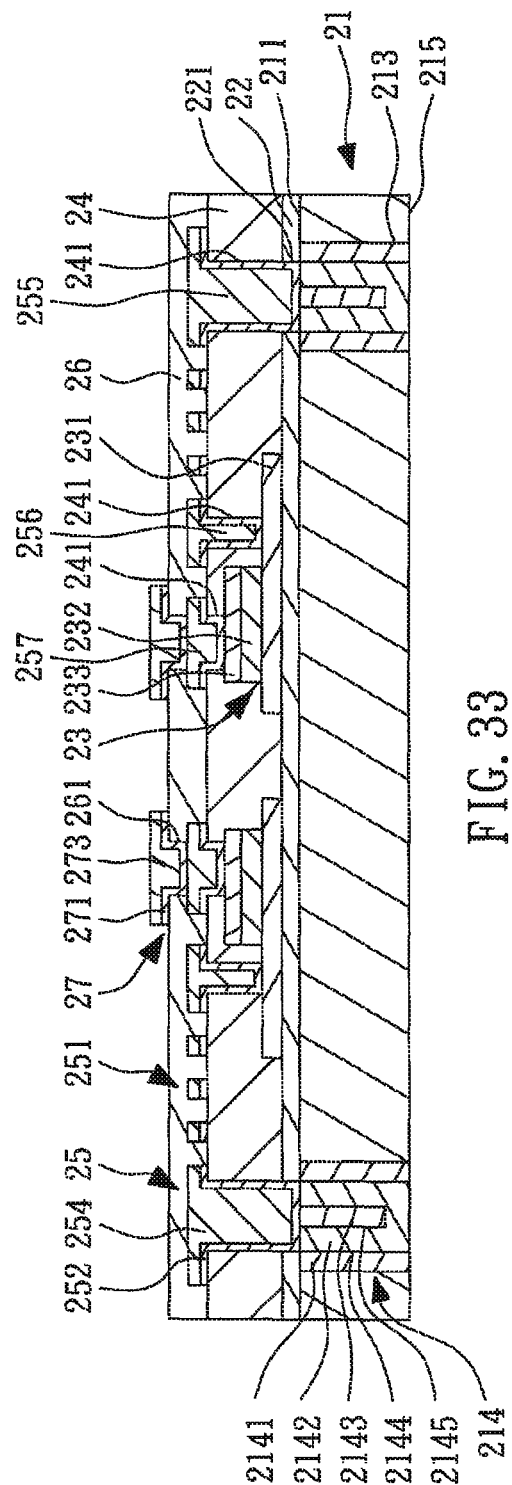
Figure 34:
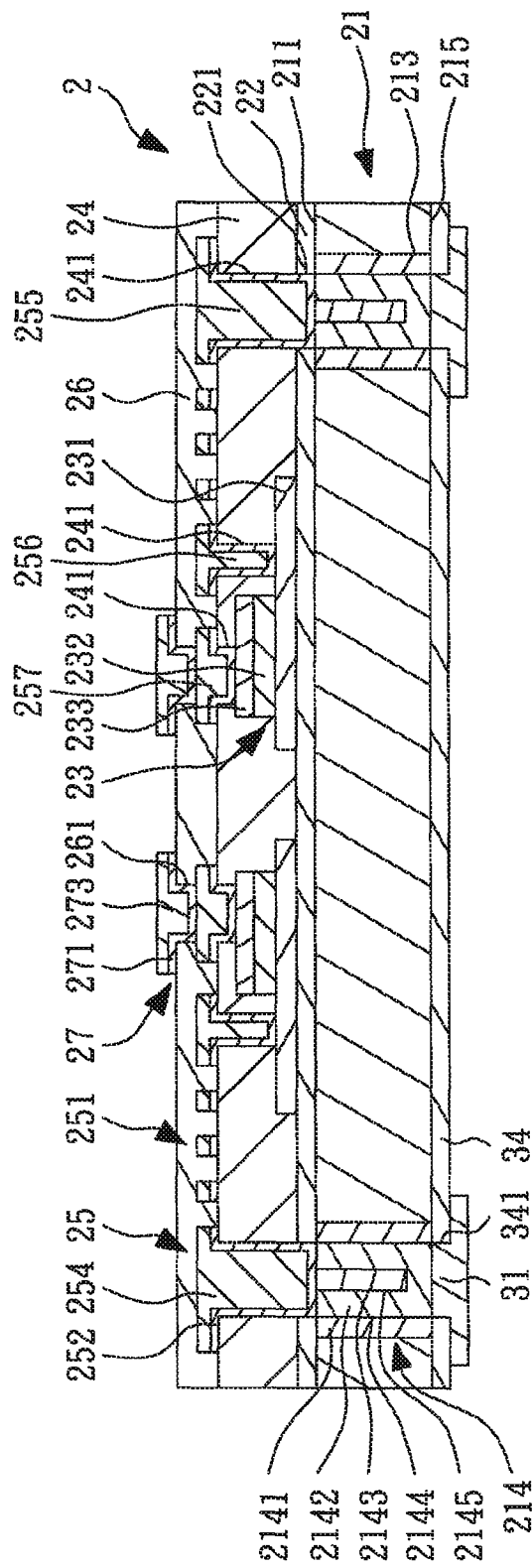

FIGS. 32-34 are schematic views of a fifth embodiment of a method for making a semiconductor package according to the present invention. The method of the fifth embodiment and that (FIGS. 2-21) of the first embodiment are substantially the same, and the same elements are designated with the same numerals. The difference between the fifth embodiment and the first embodiment, as shown in FIG. 32, is that in this embodiment, a base material 21 having a first surface 211, a second surface 215, at least one groove 213 and at least one conductive via structure is provided. The groove 213 penetrates the first surface 211 and the second surface 215. The conductive via structure is disposed in the groove 213 and exposed on the first surface 211 and the second surface 215, so as to form a through via structure 214. Then, as shown in FIG. 33, firstly, a first inductor 251 and a first capacitor 23 are formed on the first surface 211 of the base material 21. As shown in FIG. 34, secondly, at least one electrical device is formed on the second surface 215 of the base material 21, and the semiconductor package 2 is made. However, in other embodiments, the electrical device can first be formed on the second surface 215 of the base material 21, and then the first inductor 251 and the first capacitor 23 are formed on the first surface 211 of the base material 21.

While embodiments of the present invention have been illustrated and described, various modifications and improvements can be made by those skilled in the art. The embodiments of the present invention are therefore described in an illustrative but not restrictive sense. It is intended that the present invention is not limited to the particular forms illustrated, and that all modifications that maintain the spirit and scope of the present invention are within the scope defined in the appended claims.

What is claimed is:

1. A method for making a semiconductor package, comprising the steps of:
   (a) providing a base material, wherein the base material comprises at least one groove and at least one conductive via structure;
   (b) forming a first capacitor on the base material, wherein the first capacitor comprises a first lower electrode, a first dielectric layer and a first upper electrode, the first lower electrode is disposed on the base material, the first dielectric layer is disposed on the first lower electrode, and the first upper electrode is disposed on the first dielectric layer;
   (c) forming a first protective layer, so as to encapsulate the first capacitor, wherein the first protective layer comprises a plurality of first openings, and the first openings expose the conductive via structure, part of the first lower electrode and part of the first upper electrode;
   (d) forming a first metal layer on the first protective layer, wherein the first metal layer comprises a first inductor, a first interconnection metal, a second interconnection metal and a third interconnection metal, the first interconnection metal directly contacts the through via structure, the second interconnection metal directly contacts the first lower electrode, and the third interconnection metal directly contacts the first upper electrode; and
   (e) forming a second protective layer, so as to encapsulate the first inductor.

2. The method according to claim 1, further comprising a step of forming a first insulation layer on the base material after step (a), wherein the first insulation layer has a first through hole exposing the conductive via structure, and in step (b), the first capacitor is disposed on the first insulation layer.

3. The method according to claim 1, wherein in step (a), the base material comprises a first surface and a second surface, the groove penetrates the first surface and the second surface, and the conductive via structure is exposed on the first surface and the second surface, so as to form a through via structure; and in step (b), the first capacitor is disposed on the first surface of the base material.

4. The method according to claim 1, wherein in step (a), the base material comprises a first surface and a bottom surface, the groove opens at the first surface of the base material, and the conductive via structure is exposed on the first surface of the base material; and in step (b), the first capacitor is disposed on the first surface of the base material.

5. The method according to claim 4, further comprising the following steps after step (e):
   (f) disposing the base material on a carrier, wherein the first surface of the base material faces the carrier;
   (g) removing part of the base material from the bottom surface, to form a second surface and expose the conductive via structure on the second surface, so as to form a through via structure;
   (h) forming at least one electrical device on the second surface of the base material; and
   (i) removing the carrier.

6. The method according to claim 1, wherein in step (a), the base material comprises a top surface and a second surface, the groove opens at the second surface of the base material, and the conductive via structure is exposed on the second surface of the base material.

7. The method according to claim 6, further comprising the following steps after step (a):
   (a1) forming at least one electrical device on the second surface of the base material;
   (a2) disposing the base material on a carrier, wherein the second surface of the base material faces the carrier; and
   (a3) removing part of the base material from the top surface, to form a first surface and expose the conductive via structure on the first surface, so as to form a through via structure.

8. The method according to claim 1, wherein step (b) comprises the following steps:
   (b1) forming a second metal layer on the base material;
   (b2) forming a third metal layer on the second metal layer and anodizing the third metal layer, so as to form a first oxidation layer;
   (b3) forming a fourth metal layer on the first oxidation layer;
   (b4) forming a first photoresist on the fourth metal layer;
   (b5) removing part of the first oxidation layer and part of the fourth metal layer, so as to form the first dielectric layer and the first upper electrode, respectively;
   (b6) removing the first photoresist;
   (b7) forming a second photoresist on the second metal layer;
   (b8) removing part of the second metal layer, so as to form the first lower electrode; and
   (b9) removing the second photoresist.

9. The method according to claim 1, wherein step (d) comprises the following steps:
   (d1) forming a first seed layer on the first protective layer;
   (d2) forming a third photoresist on the first seed layer, so as to cover part of the first seed layer and expose part of the first seed layer;
   (d3) forming a first plated layer on the exposed part of the first seed layer; and
   (d4) removing the third photoresist and the covered part of the first seed layer, wherein the first plated layer and part of the first seed layer form the first metal layer.

10. The method according to claim 1, wherein in step (e), the second protective layer comprises at least one second opening, and the second opening exposes part of the first metal layer.

* * * * *